United States Patent [19]
Johnson

[11] Patent Number: 5,336,094
[45] Date of Patent: Aug. 9, 1994

[54] APPARATUS FOR INTERCONNECTING ELECTRICAL CONTACTS

[75] Inventor: David A. Johnson, St. Louis Park, Minn.

[73] Assignee: JohnsTech International Corporation, Minneapolis, Minn.

[21] Appl. No.: 85,292

[22] Filed: Jun. 30, 1993

[51] Int. Cl.⁵ .......................... H01R 9/09; H01R 23/72
[52] U.S. Cl. ......................................... 439/62; 439/66; 439/70; 439/73; 439/636
[58] Field of Search .......................... 439/52, 62, 66, 68, 439/70, 71, 72, 73, 91, 525, 591, 630, 634, 635, 636, 637

[56] References Cited

U.S. PATENT DOCUMENTS

| | | | |
|---|---|---|---|
| 4,445,735 | 5/1984 | Bonnefoy | 439/66 |
| 4,458,968 | 7/1984 | Madden | 439/71 |
| 4,894,022 | 1/1990 | Guckenheimer | 439/635 X |
| 4,952,156 | 8/1990 | Schmedding | 439/66 |
| 5,069,629 | 12/1991 | Johnson | 439/71 |
| 5,207,584 | 5/1993 | Johnson | 439/66 |

Primary Examiner—Z. R. Bilinsky
Attorney, Agent, or Firm—Nawrocki, Rooney & Sivertson

[57] ABSTRACT

Apparatus for electrically interconnecting a lead of an integrated circuit device to a terminal spaced at a distance from the lead, such as on a printed circuit board. The apparatus is also useful for interconnecting two printed circuit boards. The apparatus includes a housing which has at least two flanges extending therefrom. The flanges are spaced a distance with an elastomeric element captured thereby and extending therebetween. A conductive contact is mounted on the elastomeric element and thus freely suspended for contact with terminals to be interconnected. A multiplicity of such contacts may be arranged in a suitable pattern for interconnecting specified integrated circuit devices with a printed circuit board. The contact shape can be generally disk-like to provide maximum wiping action and to facilitate air-tight contact between the terminal and interconnect apparatus.

21 Claims, 4 Drawing Sheets

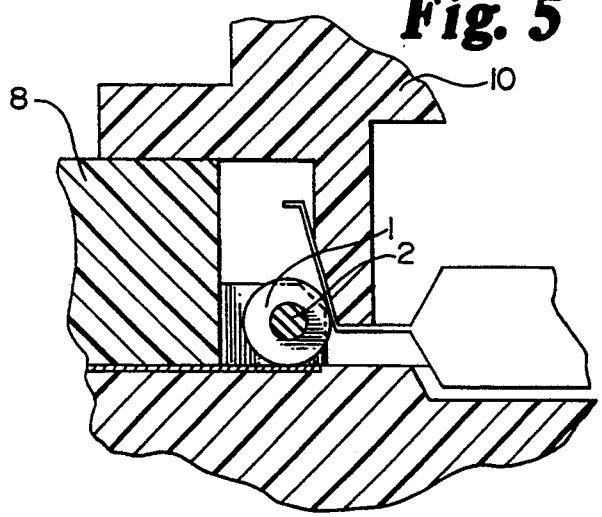
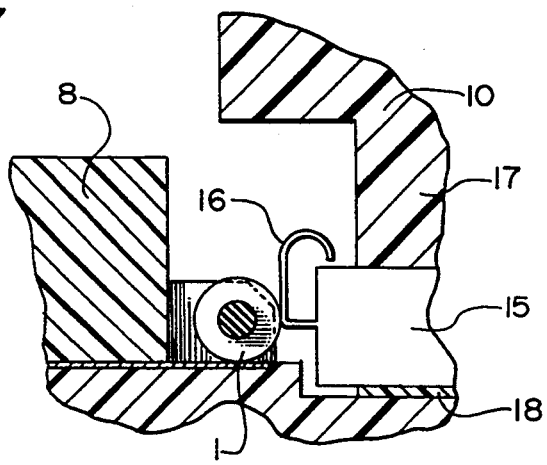
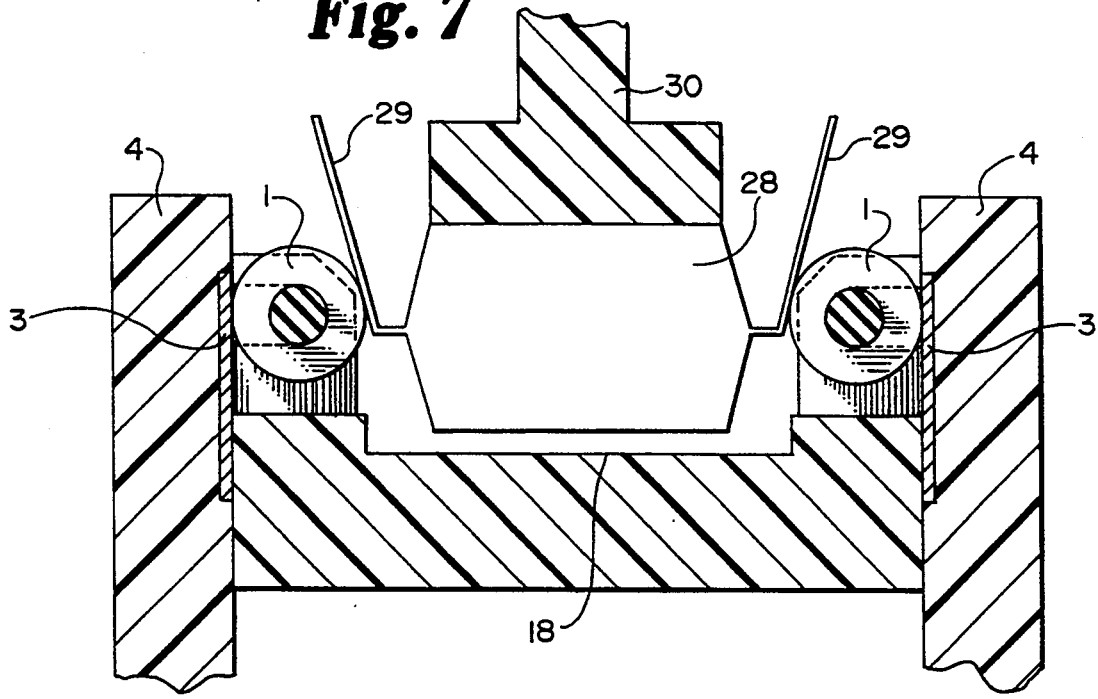

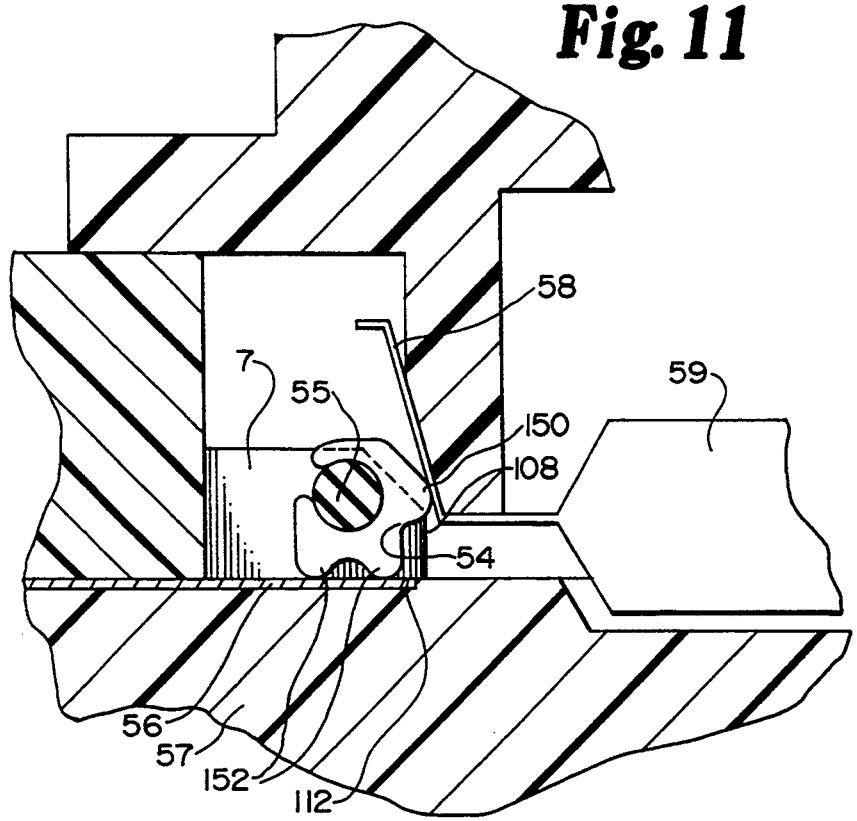
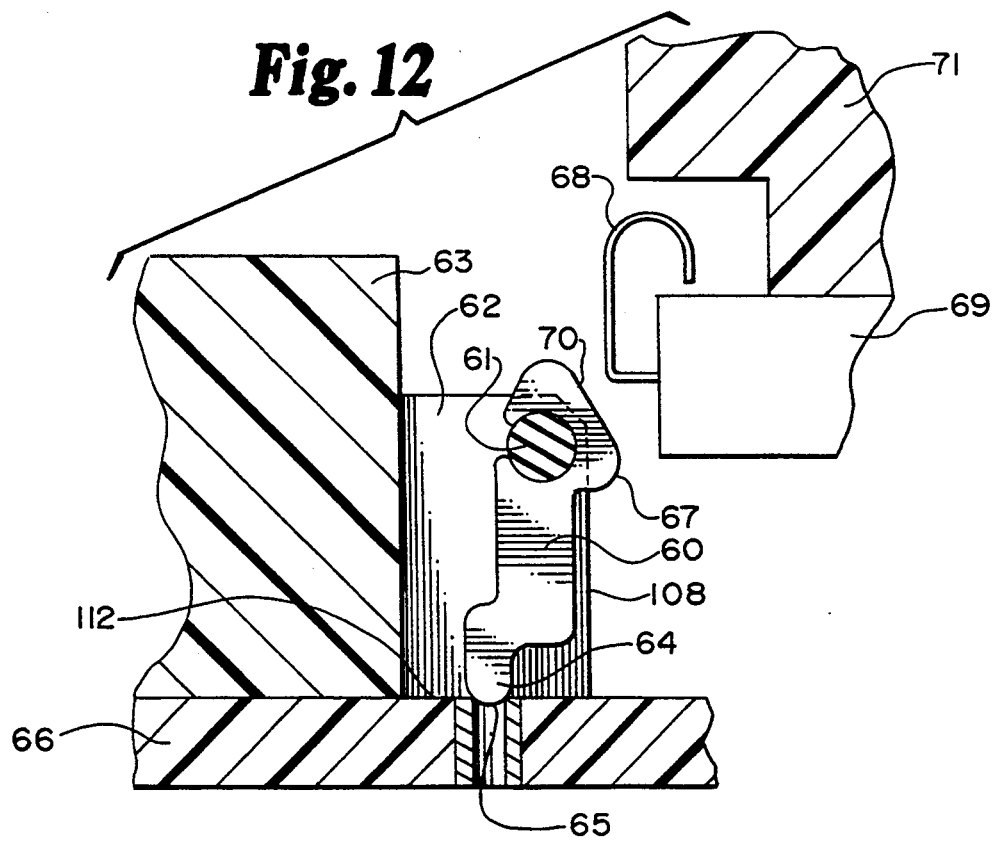

APPARATUS FOR INTERCONNECTING ELECTRICAL CONTACTS

TECHNICAL FIELD

The present invention deals broadly with the field of devices for interconnecting electrical contacts. More narrowly, however, the invention is related to technology for inter-connecting a plurality of corresponding terminals by means of an electrical conductor between an integrated circuit device and a printed circuit board or between two printed circuit boards. The device is particularly useful for interfacing an integrated circuit with a tester, including a printed circuit board, during the manufacturing process to assure operativeness. The preferred embodiment of the invention is directed to contact design and means for mounting the contacts for effecting interconnection between devices.

BACKGROUND OF THE INVENTION

Devices and methods for effecting electrical interconnection between two conductors are generally known. A specialized area of such interconnection has been recently expanding with the advent of integrated circuit technology. The chip of the integrated circuit must be electrically interconnected with the overall device by some means in order to effect interfacing between the integrated circuit and the overall device.

In the manufacturing process for making integrated circuit devices, each integrated circuit must be tested for operativeness. Thus, another application for electrical interconnection of an integrated circuit device is with a tester apparatus. To assure proper testing, the electrical interface must be of high reliability so that tested integrated circuits are not falsely found defective due to a poor electrical interconnection rather than to actual defectiveness in the integrated circuit. Testing apparatus which connect an integrated circuit device with a printed circuit board are generally referred to as a device under test (DUT) boards.

Several technologies for packaging a semi-conductor chip into an integrated circuit device have developed. These may be generally categorized as pin grid array (PGA) systems and leaded semi-conductor devices. The leaded semi-conductor devices include plastic leaded chip carriers (PLCC), dual in-line packages (DIP) and Quad Flat Pack (QFP). Each packaging type requires a particular array of contacts to be interconnected with a printed circuit board.

A further specialized area of interconnecting electrical contacts focuses on the interconnection of two printed circuit boards. These interconnections have applications utilizing insertable boards, such as memory cards, or multi-chip boards which are highly miniaturized and integrated.

All of the electrical interconnect applications described above have mechanical and electrical requirements and problems associated therewith. Each of these requirements and problems bear upon the structure which should be employed to connect the integrated circuit and the printed circuit board or two printed circuit boards.

A first mechanical consideration to be taken into account in designing an interconnect system is that a wiping action should be accomplished between the contact itself and a lead of the integrated circuit by which the contact is engaged. The wiping action functions to effect maximization of the interconnect in view of oxide build-up which can occur. In effect, the wiping action enables a good interface to be accomplished between the contact and a lead of the integrated circuit. This wiping action should be effected both on the integrated circuit contact and the printed circuit board contact. Likewise, it should be effected on both printed circuit board terminals if such apparatus is utilized for interconnecting more than one printed circuit board.

A preferred contact for the electrical interconnection of the above devices should be high speed and provide a very short path of connection. Derivatively, such a contact should have a low inductance without having a controlled impedance requirement. Further, methods of interconnection require a device that allows a mechanical compliant connection that can compensate for variations in flatness, while allowing the above-described wiping action. The objective is to develop a good low resistance electrical interconnection that is stable for a period of time. The ideal stable connection is termed a "gas-tight connection". This term refers to a connection where sufficient force and wipe action is applied between surfaces to provide a self-cleaning action to prevent air from penetrating. It is recognized that air is the prime source of non-electrical conductive oxides that form on surfaces and that air can carry and deposit forms of contaminations such as dirt, grease, oil and others.

Johnson recently disclosed in U.S. Pat. Nos. 5,069,629 (issued Dec. 3, 1991) and 5,207,584 (issued May 4, 1993) electrical interconnect contact systems which are directed to addressing both mechanical and electrical dictates outlined above. The disclosure of these references is incorporated herein by reference.

The disclosures of Johnson are directed to a generally planar contact which is received within one or more slots of a housing. Each contact is of a generally S-shaped design and supported at two locations (the hook portions of the S) by either a rigid first element or an elastomeric second element. As disclosed, the Johnson electrical interconnect provides a wiping action which enables a good interface to be accomplished between the contact and the lead of the integrated circuit. However, the degree of movement to effect the wiping action is somewhat limited by mounting the contact from two elements. Movement is further limited by the structural shape of the contact in relation to its two supports. The physical arrangement between the integrated circuit and printed circuit board is limited to applications wherein the integrated circuit device is disposed between the contacts of the device as spaced by the distance from one surface of the housing to an opposing parallel surface.

A number of other methods for connecting integrated circuits, such as PGA devices, with a printed circuit board are known. It is believed that limitations to these systems are the contact length and the usual requirement of mounting the contacts in through-holes located in a printed circuit board. The contact and through-hole mounting limits the mounting speed of the semi-conductor device while inducing discontinuities and impedance which cause signal reflections back to the source. Further, the design causes high lead inductance and thus problems with power decoupling and result in cross-talk with closely adjacent signal lines.

U.S. Pat. No. 4,894,022 discloses a solderless surface mount card edge connector. This device combines the use of a compliant contact with a mechanical clamping system that can interconnect two printed circuit boards or interconnect an integrated circuit to a printed circuit board. The limitation with this system is the complexity of the mechanical clamping system that limits the ability to simply connect and disconnect the mated terminals.

Another known method that has been used to interconnect terminals is an elastomeric sheet material that has either conductor strips or columns embedded therein. The elastomeric sheet material allows a compliant interconnection between the ends of the semi-conductor device, such as PGA device, and corresponding terminals on a printed circuit board.

Another prior art structure which seeks to accomplish the present invention is known as the Yamaichi contact. This type of contact includes an L-shaped support having a cantilevered contacting portion mounted at the distal end of the generally horizontal leg of the inverted, L-shaped support and extending generally parallel to that leg. The distal end of the contacting portion is upwardly turned so that a point thereof is engageable by a lead on an integrated circuit device to be contacted. The support, in turn, is engaged with or through a pad or terminal portion of a printed circuit board. The cantilevered portion of the Yamaichi contact is somewhat flexible to facilitate a wiping action. However, as designed, the Yamaichi contact as susceptible to bending of the lead on the integrated circuit. Further, the Yamaichi device does not sufficiently consider electrical considerations.

U.S. Pat. No. 4,445,735 which issued on May 1, 1984 illustrates another type of electrical connection device. The device of that patent serves to establish an electrical connection between contacts of a circuit network on a substrate and contact pads of a conductor network on a printed circuit board. This device is an improvement over the Yamaichi contact by operating at a higher speed and lower inductance. The device has elastomeric means for mounting one or more contacts in the housing. The elastomeric biasing and mounting enables a wiping action to be effected at both upper and lower ends of the contact. That is, both the end which engages an integrated circuit lead and the end which engages a printed circuit board contact pad can be wiped across the surfaces intended to be contacted.

The device of the '735 patent, however, retains some limitations. While some wiping action is afforded at both upper and lower ends of the contact, the amount of such wiping action is relatively limited because of the elastomeric elements being used generally for effecting biasing rather than free-floating suspension of the contact. As a result of the mounting means incorporated in the '735 patent, there will be a primary tendency for traction of the contact point in a generally vertical direction, but there will be only a small component of lateral movement to effect wiping. Additionally, because of the lack of any sufficient free-floating effect, lead bending on an integrated circuit tester can occur.

Accordingly, a need exists for an improved electrical interconnect system to be utilized for interconnecting integrated circuit devices with printed circuit boards or for interconnecting multiple printed circuit boards. The interconnecting device should be of relatively inexpensive design yet provide high speed, low inductance, solderless electrical interconnection. Further, the design should include compliant contacts which compensate for irregularities on the surface and other phenomena between the devices by incorporating free-floating of the contacts. Finally, the contacts should provide controlled wiping action to assure stable interconnection.

The present invention addresses these needs as well as other problems associated with electrical interconnect systems. The present invention also offers further advantages over the prior art and solves problems associated therewith.

SUMMARY OF THE INVENTION

The present invention is directed to an apparatus for interconnecting electrical contacts. Specifically, the design focuses on the interconnect contact between devices. The interconnect contact device is particularly useful for connecting semi-conductor devices to printed circuit boards. The semi-conductor devices include pin grid array (PGA) devices or leaded semi-conductor devices such as QFP, PLCC, or DIP devices. The present invention is also useful for interconnecting two printed circuit boards.

The electrical interconnect system uses a method of short conductor contacts that are solderless surface-mounted by a single elastomeric element that provides suspension in a free-floating position of the conductors and contacts while providing biasing in forming a compliant contact when in use in contact with terminal pairs. The invention allows for high speed, low inductance interconnection between a pair or a plurality of corresponding terminals by electrical conductors that are oriented and electrically separated within a slotted housing.

The interconnection apparatus is typically surface mounted to a plane of terminals and provides means for aligning or guiding another set of corresponding terminals that can be configured as leaded semi-conductor devices or pinned semi-conductor devices or mating a printed circuit board with corresponding planar terminal pads. It is also recognized that the interconnection apparatus could be configured as an independent element with the interconnecting contacts of an alignment guiding method allowing terminals to be inserted into the apparatus and electrically mated.

A recognized use for the device is "dead" bug testing of leaded semi-conductor devices. Further, the apparatus can be used with multiple printed circuit boards which are connected together to be used for applications such as high speed bus connections or memory card connections.

As previously stated, the design provides high speed and low noise of the electrical interconnection. Further, the design allows very high density of contacts due to the contact design. Further, the contact link short and electrical inductance is minimized. This reduces the amount of noise generated and the ability to reduce ground bounce and settling time. In this way, the lower inductance leads to better testing yields because the user can pass more articles by eliminating false defects due to the contact design.

In its broadest sense, the electrical interconnect system of the present invention includes a housing having at least two spaced ribs extending therefrom. The space between the ribs includes an elastomeric element suspended therebetween. A contact of a generally disk shape having a throughhole at its centerpoint perpendicular to its radial planar surfaces is mounted on the elastomeric element. The elastomeric element extends through the throughhole. The disk-shaped contact is manufactured from a conductive material. As mounted, it provides a free-floating contact with a portion of the disk extending beyond the lateral surface of the rib on at least two sides. This provides two locations for contact such as by a first contact with the leaded semi-conductor device and a second with the contact pad of a printed circuit board.

The present apparatus for electrically interconnecting corresponding terminals of the devices includes a housing. The housing has a first surface spaced apart from a second surface and a lateral surface extending therebetween along at least a portion of the perimeter of the first and second surfaces.

A plurality of ribs project from the lateral surface of the housing. Each of the ribs has a terminal surface distant from the lateral surface of the housing along with an upper and lower surface adjacent the terminal surface and extending to the lateral surface of the housing. Any two adjacent ribs define a contact receiving channel. The contact receiving channel is bound on three sides by the lateral surface, a first lateral surface of one of the adjacent ribs and an opposing lateral surface of the other of the adjacent ribs. The width of the channel is defined by the distance between the first lateral surface of a rib and the opposing lateral surface of the adjacent rib. A single elastomeric element is suspended across the width of the contact receiving channel. The single elastomeric element is secured to the adjacent ribs. A contact is secured to and freely suspended from the single elastomeric element and manufactured from a conductive material.

In a preferred embodiment, the contact includes a disk-like shape conductive element. The disk-shaped conductive element has a radial planar surface and a throughhole proximate the radial centerpoint which is generally perpendicular to the radial planar surfaces. The single elastomeric element passes through the throughhole of the disk-shaped conductive element to secure and freely suspend the contact.

The apparatus of the present invention can also include means for limiting the rotation of the disk-shaped contact about a line through the radial centerpoint of the contact. While an integrated circuit device will, typically, be subjected to only one abrasive engagement by the disk-shaped contact, the contacts themselves and terminals on a printed circuit board engaged by the contacts will be subjected to repetitive abrasive action. Consequently, by providing such means for limiting the rotation of the contact, erosion can be minimized. Further, the distinction must be made between the solder-traced terminals of a semi-conductor device and the gold-traced terminals of the printed circuit board. It is desirable that the gold-traced terminals of the printed circuit board not be contaminated by the solder tracing of the semi-conductor device terminals. Again, by minimizing the angular rotation of the disk-shaped contacts, such contamination can be prevented.

The means for limiting rotation can include a projection extending outward from the lateral surface of the housing in registration with a groove on the contact which extends towards the radial centerpoint from the perimeter of the contact. The means for limiting rotation of the contact could alternatively include a projection extending radially outward from the perimeter of the contact which is in registration with a slot formed into the lateral surface of the housing.

Contact design of the present invention may be varied to achieve the same result. For example, in an alternative embodiment, the contact can be formed from a conductive wire having a first and a second end. The conductive wire is bent generally to conform to the shape of the cross-section of the single elastomeric element. The first and second ends may then be bent away from the surface of the elastomeric element to form a pair of nubs having a circumferential space therebetween along the perimeter of the elastomeric element. With this contact embodiment, the means for limiting the rotation of the contact can include a projection extending outward from the lateral surface of the housing which is in registration with the circumferential space between the nubs.

Several methods for connecting the elastomeric element to the plurality of ribs are recognized. In one embodiment, each of the ribs has a channel formed therein for receiving the elastomeric element. The channel of the rib has a width smaller than the diameter of the elastomeric element so that the elastomeric element is secured under compression when received in the channel. This may be accomplished by stretching the elastomeric element to reduce its diameter, followed by insertion into the channel, then releasing tension on the element so that it expands to friction fit with the channel.

The plurality of ribs can be aligned to define multiple contact receiving channels. Each of these channels would receive a contact. The ribs can be aligned along a common line extending through each of the ribs so that a single elastomeric element of sufficient length be utilized to support multiple contacts.

In a preferred embodiment, the radial planar surface is of the contact is freely suspended from the elastomeric element extend beyond both the terminal end of each adjacent rib and the lower surface of each adjacent rib for exposing the contact. The contact is exposed for engagement of a terminal. When in contact with the terminal, the elastomeric element as biased assures good connection between the terminal and the contact.

In an alternative embodiment, the contact can comprise a planar conductive element having a single nub extending beyond the terminal end of each of the adjacent ribs. The planar conductive element also has multiple hubs extending beyond the bottom of each adjacent rib wherein the nubs provide points of electrical contact between the terminals of two devices.

Alternatively, the contact can comprise a planar conductive element having a first nub extending beyond the terminal end of each adjacent rib for electrical contact with a terminal of the first device. The contact would further include a second nub extending beyond the bottom of each of the adjacent ribs. The second nub is sized for conductive reception in a throughhole contact of a printed circuit board.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

BRIEF DESCRIPTION OF THE DRAWINGS

In the drawings, in which like reference numerals indicate corresponding parts or elements of preferred embodiments of the present invention throughout the several views:

FIG. 5 is a fragmentary side elevational view depicting a disk-shaped contact design, as in FIG. 1, which allows full rotation of the circular contact;

FIG. 6 is a fragmentary side elevational view with some parts cut away showing the apparatus of FIG. 5 as interconnected with a J-shaped contact of a semi-conductor device;

FIG. 7 is a fragmentary side elevational view with some parts cut away showing an embodiment of a contact of the present invention in use interconnecting a DIP device;

FIG. 11 is a fragmentary side elevational view with some parts cut away showing an alternative contact design; and FIG. 12 is a fragmentary side elevational view with some parts cut away showing an embodiment in which the contact is designed for use with a printed circuit board having a throughhole contact.

DETAILED DESCRIPTION OF THE INVENTION

Detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one of skill in the art to variously practice the invention.

Figure 1:
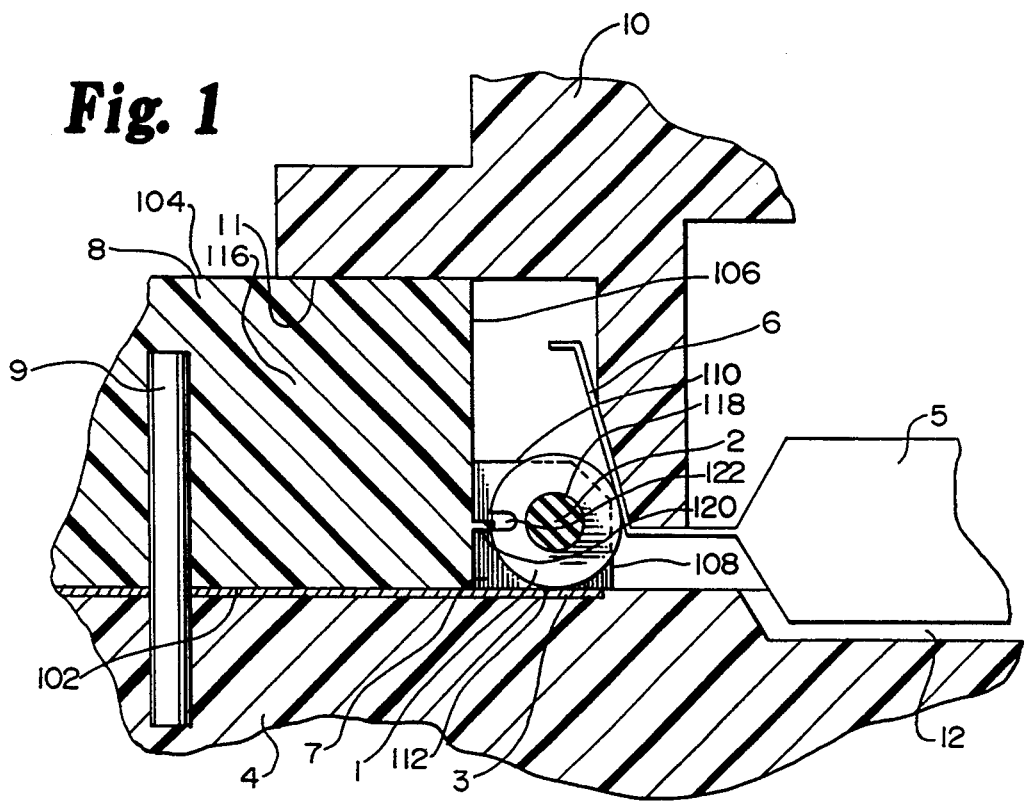
FIG. 1 is a fragmentary side elevational view with some parts cut away showing a generally disk-shaped contact of the present invention as utilized interconnecting a printed circuit board with a leaded semi-conductor device.

Now referring to FIG. 1, an illustrative embodiment of a device of the present invention is depicted. A contact 1 is designed as a "wheel" or "disk" shape, consisting of an outside diameter (generally in the size range of about 0.030 to about 0.10 inches) with an inner hole (typically about 0.010 to about 0.050 inch diameter), sometimes round, allowing an elastomeric element 2 of the same shape, generally as a cylinder, to bias the contact 1 against a corresponding terminal 3 attached, for example, to a printed circuit board 4. Electrical interface is, thereby, effected between circuit board 4 and a semi-conductor device 5 leaded terminal 6 with sufficient pressure to result in a low resistance electrical interconnection.

The elastomeric element 2 can vary in its hardness. It has been found that a hardness of 30–90 Shore A is an appropriate range. A hardness of 70 Shore A has been found to be particularly appropriate.

Figure 8:
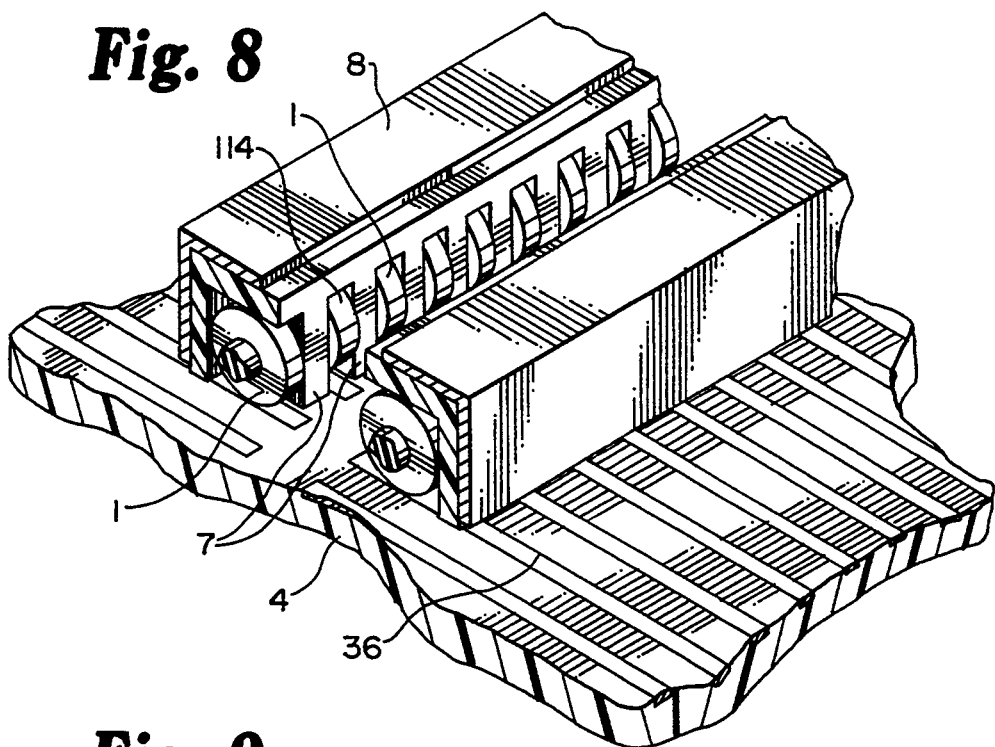
FIG. 8 is an enlarged fragmentary perspective view of an embodiment of the present invention for use in contacting multiple terminals such as those on the edge of a printed circuit board.

To achieve a plurality of interconnections the contact 1 is retained within contact receiving channel 114 separated by ribs 7 that are part of a housing 8 that comprises the apparatus for contacting. Multiple ribs 7 are best illustrated in FIG. 8. The housing 8 provides means of mechanically aligning the housing 8 and its respective contacts 1 to a printed circuit board 4 generally by means of close tolerance alignment pins 9. The overall apparatus also requires that the mating terminal leads 6, i.e. of a semi-conductor device 5, be closely aligned to the array of contacts 1. This is generally accomplished by an alignment feature that guides the edges of the device leads (not shown).

While FIG. 1 illustrates a contact 1 whose tangent at the point of engagement is substantially coplanar with an undersurface of housing 8, it will be understood that preloading of contact 1 would be appropriate. That is, typically, the lower periphery of contact 1 would extend downwardly from the undersurface of housing 8. Typically, this distance would be between 0.003 inches and 0.005 inches. By so preloading contact 1, appropriate force (i.e., in the range between 20 and 40 grams) can be exerted on contact 1 by terminal 3 of the printed circuit board 4. As a result, an appropriate vector resolution will result when lead 6 of a semiconductor device 5 is brought into engagement with contact 1.

FIG. 1 further shows the configuration having a leadbacker 10 that applies the actuation force against the device 5 leads 6 to interconnect with the contact wheel 1. The leadbacker 10 provides actuation force and also lead support, to prevent bending to the device leads 6 and is part of a nest which can be integrated with an automated test handler (typically with a vacuum chuck retaining the device) within the nest, or a manual cover assembly (not shown) that is part of a test socket that is integrated with hinged cover, at one end, and a locking mechanism at the other end. As part of the leadbacker 10 an overtravel stop 11 is used to control the amount of device lead actuation. This is to control the amount of contacting force, and to optimize the life of the test socket. As a result of the over travel stop a gap 12 is left under the device 5 to prevent lead 6 damage.

In all embodiments of the present invention, the apparatus for electrically interconnecting corresponding terminals of two devices includes a housing 8 having a first surface 102 spaced from a second surface 104 and a lateral surface 106 extending therebetween along at least a portion of the perimeter of the first and second surfaces 102, 104.

A plurality of ribs 7 projects from the lateral surface 106. Each of the ribs 7 has a terminal surface 108 distal from the lateral surface 106 and an upper surface 110 and lower surface 112 adjacent the terminal surface 108 extending to the lateral surface 106 of the housing 8.

As best depicted in FIG. 8, a contact receiving channel 114 is formed between two adjacent ribs 7. The contact receiving channel 114 is bounded on three sides by the lateral surface 106, a first lateral surface 116 of one of the adjacent ribs and an opposing lateral surface (not shown in FIG. 1) of the other of said adjacent ribs 7. The width of the channel is defined by the distance between the first lateral surface 116 and the opposing lateral surface of the adjacent rib.

As depicted in FIG. 1, the single elastomeric element 2 is suspended across the width of the contact receiving channel 114 and secured to the adjacent ribs 7. As such, the contact is secured to and freely suspended from the single elastomeric element.

The conductive contact 1 of the present invention is preferably a disk-shaped conductive element. The disk-shaped conductive element has opposing radial planar surface and a throughhole proximate a radial centerpoint which is generally perpendicular to the radial planar surfaces. A single elastomeric element 2 passes through the throughhole 118 to secure and freely suspend the contact 1.

FIGS. 1 through 5 depict alterative contact designs. As defined herein, a disk-shaped contact would encompass each of the designs depicted in these figures. FIG. 5 depicts a disk-like contact 1 which is fully rotatable by the single elastomeric element 2 about a line through the radial centerpoint of the contact 1. The embodiments depicted in FIGS. 1 through 4 include means for limiting the rotation of the contact 1 about a line through the radial centerpoint.

Figure 3:
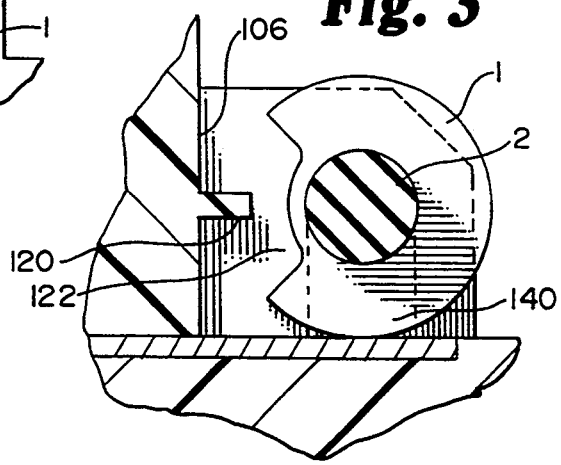
FIG. 3 is a fragmentary side elevational view with some parts cut away showing another alternative contact design.
Figure 4:
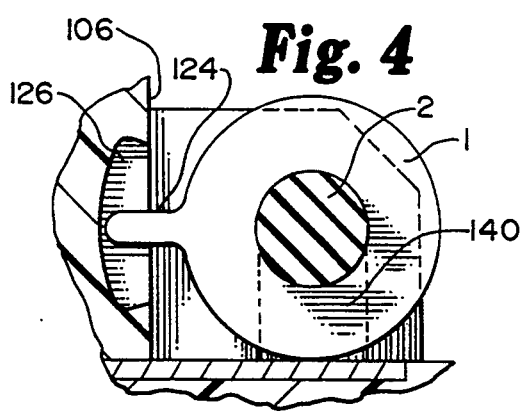
FIG. 4 is a fragmentary side elevational view with some parts cut away showing an alternative contact design.

FIGS. 1 and 3 depict embodiments wherein the means for limiting the rotation of the contact 1 includes a projection 1 to 0 extending from the lateral surface 106 of the housing 8 in registration with a group 112 on the contact 1 and extending toward the radial centerpoint from the perimeter of the contact 1. Alternatively, as depicted in FIG. 4, the means for limiting the rotation of the contact 1 can include a projection 124 extending radially outward from the contact 1 in registration with a slot 126 formed in the lateral surface 106 of the housing 8.

Figure 2:
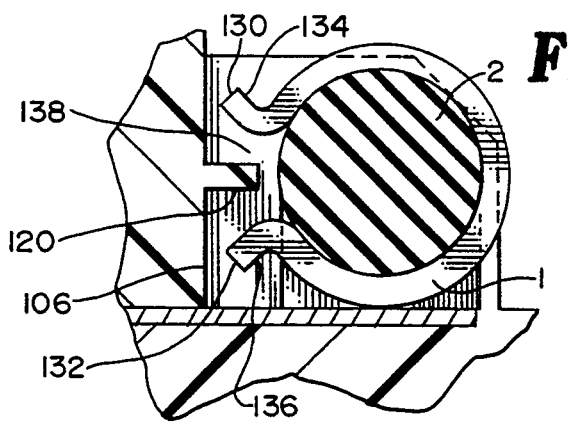
FIG. 2 is a fragmentary side elevational view with some parts cut away showing an alternative contact design.

FIG. 2 depicts an alternative contact 1 embodiment in which the contact is made from or formed from a conductive wire. The conductive wire has a first end 130 and a second end 132. The conductive wire is bent to generally conform to the shape of the cross-section of the elastomeric element 2. The first end 130 and second end 132 are bent away from the surface of the elastomeric element 2 to form a pair of nubs 134, 136, respectively. The circumferential space 138 is formed between the nubs 134, 136 along the perimeter of the elastomeric element 2. The means for limiting rotation of the contact in this embodiment include a projection 120 extending outward from the lateral surface 106 of the housing 108 in registration with the circumferential space 138.

In a preferred embodiment, the radial planar surfaces of the contact 1 is freely suspended from the elastomeric element 2 extend beyond the terminal end 108 of said adjacent ribs 7 and the lower surface 112 of the adjacent ribs for electrically contacting the terminals 102, of two devices at two locations on the contact 1.

The apparatus is assembled with the ribs holding the interconnection contacts 1 retained in the housing 8 by the slight compression force of the elastomeric element 2 due to a larger diameter elastomer, approximately 0.001–0.002 inch, relative to a cross slot 140 width. The cross slot 140 in a rib 7 is depicted in phantom in FIGS. 3 and 4. The position of cross slot 140 allows the contacts 1 to extend beyond the bottom of the housing 8 and bottom surface 112 of the rib 7 by a distance of about 0.005 to 0.010 inch. When the apparatus is mounted to the printed circuit board 4 the contacts 1 compress the elastomer 2 that provides the contact biasing force establishing an electrical interconnection. When mounted, on the printed circuit board 4 the contact 1 is biased by the elastomer and will tend to center, due to force balancing, around the centerline of the cross slot retaining the elastomer 2 or radial centerline of the contact 1. The apparatus is designed with a gap that allows the device lead to deflect the contact. The contact will either roll or slide along the terminal 3 depending on where the greater frictional force is: between the contact and lead, or the contact and the terminal 3. The alignment pin 9, or pins, aligns the apparatus to the printed circuit board 4.

FIGS. 5 and 6 show two embodiments of actuating different types of semi-conductor devices. FIG. 5, as described above for FIG. 1, is a lead supported and actuated device. This is typical of QFP and SOIC types of devices, two of the most commonly used surface mounted devices. FIG. 6 shows a device body 15 actuated device having a "J" lead 16 terminal that interconnects to the apparatus contact 1. The body actuator 17 will typically actuate the device body 15 down to a hard stop 18. In some designs the hard stop 18 is replaced by a spring loaded "floor" that the device would be seated against to allow ejection of a device out of the test socket.

FIG. 7 shows a test setup for one of the most common semi-conductor device types, a DIP device 28 with terminal 29 that is electrically connected to the contacts 1. For this device, the body 28 of the device is pressed on to the contacts 1 by an actuator 30 typically down to a hard stop 18 or by using a spring-loaded floor. As depicted, the orientation of the printed circuit board 4 and the terminal 3 is perpendicular, although other arrangements are recognized as possible.

As previously stated and best shown in FIG. 8, the apparatus housing 8 has ribs 7 and the respective contact receiving channels 114 formed by two adjacent ribs 7. The slot width varies with the pitch of the contacts needed to interconnect with the device. The typical slots are 0.014 inch wide for pitches of 0.025" and greater. For smaller pitch the contact width matches close to the width of the device lead. At 0.4 mm (approximately 0.0157") the contact width is approximately 0.0065" and the slot width measures approximately 0.0069". The close tolerance between the contact and the slot width is required to increase the pointing accuracy of the contact. That is, the contact has to be controlled from having to much side-to-side motion to interconnect to the device lead with high precision and reliability.

The present invention may be utilized for "dead" bug testing of a semi-conductor device. The contacts are arranged or configured to match the terminal array of the semi-conductor device. As is readily apparent a housing may be configured in any pattern with multiple rows and multiple contacts in each row. A single elastomeric element 2 of sufficient length may extend over the length of a row of ribs to support multiple contacts 1.

Figure 9:
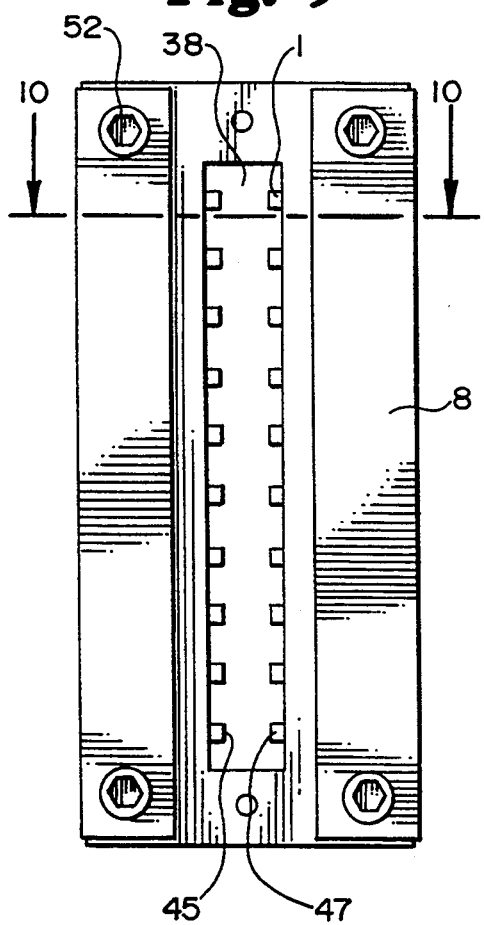
FIG. 9 is a top elevational view of the embodiment of the apparatus of FIG. 8.
Figure 10:
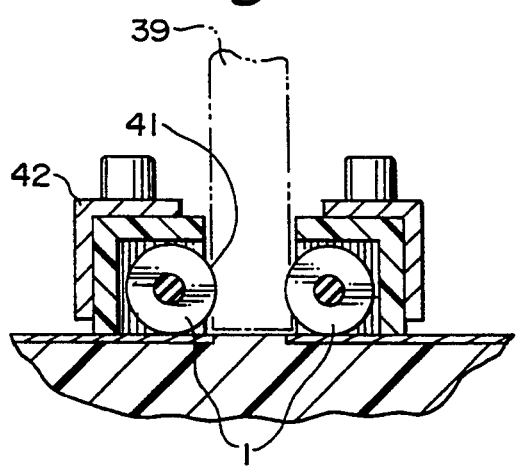
FIG. 10 is a side elevational view showing the embodiment of FIG. 8 with a printed circuit board inserted therein.

Now referring to FIG. 8, another major application of the "wheel contact" or "disk contact" is with the electrical interconnection of two printed circuit boards. FIGS. 8 and 9 show the apparatus mounted to a printed circuit board 4 for receiving another printed circuit board to be inserted. FIG. 9 shows alignment pins for maintaining the proper positioning of the printed circuit board 4. The apparatus consists of the housing 8 with the contacts 1 and elastomers 2 mounted and already connected to a printed circuit board 4 with terminals 36. The contacts 1 are separated by ribs 7 that are part of the housing 8. A slot 38 is formed in the housing 8 to allow the insertion of another printed circuit board 39. The contact 2 protrudes a distance into the slot 38 opening to allow the mating board 39 terminals 41 to be interconnected. For a long connector apparatus an angle metal stiffener 42 may be required to increase the apparatus stiffness when mounting to a printed circuit board.

As illustrated, the device is utilized with a double sided printed circuit board having terminals on either side mating with separate contacts to another printed circuit board.

A top view of FIG. 9 shows how the apparatus has the slot opening 38 for a printed circuit board and the contacts 45 and 47 projecting into the slot 38 opening. The apparatus is mounted typically by screws 52 and aligned to the printed circuit board 4 by alignment pins.

Another method of contact terminal interaction is depicted in FIG. 11, where the contact 54 is biased by an elastomer 55 and is allowed to slide parallel across the terminal 56 of the printed circuit board 57. The mating terminal 58 of the device 59 would be inserted forcing the contact side deflection along the corresponding terminal. The elastomer 55 is retained by the ribs and provides a biasing force to the terminal with sufficient force to maintain a low resistance electrical interconnection as with previously disclosed embodiments.

The contact 54, as depicted in FIG. 11, includes a planar conductive element having a single nub 150 extending beyond the terminal end 108 of each of the adjacent ribs 7. Multiple nubs 152 extend beyond the bottom surface 112 of each of the adjacent ribs 7. The multiple nubs 152 and the single nub 150 provide points for electrical contact between the terminals of the two devices.

FIG. 12 depicts another alternative design of contact terminal interaction which would be for use with a contact designed to pivot on one of the terminals. The contacts 60 as biased by an elastomer 61 is guided within a slot formed by ribs 62 as part of the housing 63. The bottom end of the contact is the terminal 64 that is located and biased to a VIA 65 located in a printed circuit board 66. The contacts could be arranged with multiple locations for the terminal 64 to allow the VIA's to be staggered to achieve very fine pitch contact centers. The contact 60 tips 67 engages the device 69 lead terminal 68. To allow easier device lead 68 engagement a lead-in angle 70 is provided on the top of the contact 60. Device actuation with this type of device is made by an actuator 71.

As depicted in FIG. 12, the contact 60 comprises a planar conductive element having a first nub 67 extending beyond the terminal end 108 of the adjacent ribs 62 for electrical contact with a terminal of the first device. The contact further includes a second nub 64 extending beyond the bottom surface 112 of each of the adjacent ribs 62. The second nub is sized for conductive reception in a throughhole contact 65 of a printed circuit board 66.

In all embodiments of the present invention, the interaction of the contact results in a rotation or a rotational wipe action with each of the terminals. This is a function of the corresponding frictional forces between the terminals and the contact. It is possible that optimal designs could be achieved by manufacturing with given micro surface roughness to establish the desired electrical interconnection. Along with this may be different specifications of surface plating finishes. One surface could be gold plate over a sub-plated surface of i.e. nickel. The hard underplate could serve to act as a bearer coating for the base material of the contact or the terminal, and or act as a hard surface to enhance the mechanical wear resistance to give prolonged life to cyclic use of connection/disconnections.

Further, the invention is an electrical interconnection method using a single elastomeric biased contact that provides an electrical interconnection method between two independent terminals.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

What is claimed is:

1. Apparatus for electrically interconnecting corresponding terminals of two devices, comprising:
   (a) a housing, said housing having a first surface spaced apart from a second surface and a lateral surface extending therebetween along at least a portion of a perimeter of said first and said second surfaces;
   (b) a plurality of ribs projecting from said lateral surface, each of said ribs having a terminal surface distal from said lateral surface and an upper and a lower surface adjacent said terminal surface extending to said lateral surface, wherein any two adjacent ribs define a contact receiving channel, said channel bounded on three sides by said lateral surface, a first lateral surface of one of said adjacent ribs and an opposing lateral surface of the other of said adjacent ribs, wherein the width of said channel is defined by the distance between said first lateral surface and said opposing lateral surface of said adjacent ribs;
   (c) a single elastomeric element suspended across said width of said contact receiving channel and captured by said adjacent ribs; and
   (d) a contact secured to, and freely suspended from, said single elastomeric element, said contact constructed from a conductive material.

2. The apparatus of claim 1, wherein said contact includes a disk-shaped conductive element, said disk-shaped conductive element having opposing radial planar surfaces and a throughhole proximate a radial centerpoint generally perpendicular to said radial planar surface, wherein said single elastomeric elements passes through said throughhole to secure and freely suspend said contact.

3. The apparatus of claim 2, further comprising means for limiting the rotation of said contact about a line through said radial centerpoint.

4. The apparatus of claim 3, wherein said means for limiting the rotation of said contact includes a projection extending outward from said lateral surface of said housing in registration with a groove on said contact extending toward the radial centerpoint from the perimeter of said contact.

5. The apparatus of claim 2, wherein said means for limiting the rotation of said contact includes a projection extending radially outward from said contact in registration with a slot formed into the lateral surface of said housing.

6. The apparatus of claim 2, wherein said contact is formed from a conductive wire, having a first end and a second end, bent to generally conform to the shape of the cross-section of said elastomeric element, said first and said second ends bent away from the surface of said elastomeric element to form a pair of nubs having a circumferential space therebetween along the perimeter of said elastomeric element.

7. The apparatus of claim 6, further comprising means for limiting the rotation of said contact about a line through said radial centerpoint, said means including projection extending outward from said lateral surface of said housing in registration with said circumferential space.

8. The apparatus of claim 2, wherein each of said ribs has a channel formed therein for receiving said elastomeric element, said channel having a width smaller than the diameter of said elastomeric element so that said elastomeric element is secured under compression when received in said channel.

9. The apparatus of claim 8, wherein said plurality of said ribs define multiple contact receiving channels for receiving a contact in each of said channels by suspending a single elastomeric element through a common line extending through each of said ribs.

10. The apparatus of claim 2, wherein said radial planar surfaces of said contact as freely suspended from said elastomeric element extend beyond both said terminal end of said adjacent ribs and said lower surface of said adjacent ribs for electrically contacting said terminals of two devices at two locations on said contact.

11. The apparatus of claim 1, wherein said contact comprises a planar conductive element having a single nub extending beyond said terminal end of each of said adjacent ribs and multiple nubs extending beyond the bottom of each of said adjacent ribs wherein said nubs provide points of electrical contact between said terminals of said two devices.

12. The apparatus of claim 1, wherein said contact comprises a planar conductive element having a first nub extending beyond said terminal end of said adjacent ribs for electrical contact with a terminal of a first device, said contact further including a second nub extending beyond the bottom of each of said adjacent ribs, said second nub sized for conductive reception in a throughhole contact of a printed circuit board.

13. Apparatus for electrically interconnecting corresponding terminals of two devices comprising:
(a) a housing, said housing having a first surface spaced apart from a second surface and a lateral surface extending therebetween along at least a portion of the perimeter of said first and said second surfaces;
(b) a plurality of ribs projecting from said lateral surface, each of said ribs having a terminal surface distal from said lateral surface and an upper and a lower surface adjacent said terminal surface extending to said lateral surface, wherein any two adjacent ribs define a contact receiving channel, said channel bounded on three sides by said lateral surface, a first lateral surface of one of said adjacent ribs and an opposing lateral surface of the other of said adjacent ribs, wherein the width of said channel is defined by the distance between said first lateral surface and said opposing lateral surface of said adjacent ribs;
(c) a single elastomeric element suspended across said width of said contact receiving channel secured to said adjacent ribs; and
(d) a disk-shaped contact, said contact constructed from a conductive material and having opposing radial planar surface and a throughhole proximate a radial centerpoint generally perpendicular to said radial planar surface, wherein said single elastomeric elements passes through said throughhole to secure and freely suspend said contact, said radial planar surfaces of said contact as freely suspended from said elastomeric element extend beyond both said terminal end of said adjacent ribs and said lower surface of said adjacent ribs for electrically contacting said terminals of two devices at two locations on said contact.

14. The apparatus of claim 13, further comprising means for limiting the rotation of said contact about a line through said radial centerpoint.

15. The apparatus of claim 14, wherein said means for limiting the rotation of said contact includes a projection extending outward from said lateral surface of said housing in registration with a groove on said contact extending toward the radial centerpoint from the perimeter of said contact.

16. The apparatus of claim 14, wherein said means for limiting the rotation of said contact includes a projection extending radially outward from said contact in registration with a slot formed into the lateral surface of said housing.

17. The apparatus of claim 13, wherein said contact is formed from a conductive wire, having a first end and a second end, bent to generally conform to the shape of the cross-section of said elastomeric element, said first and said second ends bent away from the surface of said elastomeric element to form a pair of nubs having a circumferential space therebetween along the perimeter of said elastomeric element.

18. The apparatus of claim 17, further comprising means for limiting the rotation of said contact about a line through said radial centerpoint, said means including projection extending outward from said lateral surface of said housing in registration with said circumferential space.

19. The apparatus of claim 13, wherein each of said ribs has a channel formed therein for receiving said elastomeric element, said channel having a width smaller than the diameter of said elastomeric element so that said elastomeric element is secured under compression when received in said channel.

20. The apparatus of claim 19, wherein said plurality of said ribs define multiple contact receiving channels for receiving a contact in each of said channels by suspending a single elastomeric element through a common line extending through each of said ribs.

21. Apparatus for electrically interconnecting corresponding terminals of two spaced devices, comprising:
(a) a housing defining a plurality of generally-parallel, spaced contact receiving channels therewithin and a trough extending across said channels, said housing having first and second surfaces, said housing being disposed intermediate corresponding terminals of the two devices;
(b) a single elastomeric element received within said trough and extending across said channels;
(c) a contact supported by said elastomeric element and received within each channel, said contact extending outwardly from said first and second surfaces of said housing to engage said terminals of the two devices; and
(d) wherein, as said contact engages one of the terminals of the devices, said elastomeric element is torsionally distorted.

* * * * *